United States Patent [19]

Noble

[11] Patent Number: 5,650,654

[45] Date of Patent: Jul. 22, 1997

[54] MOSFET DEVICE HAVING CONTROLLED PARASITIC ISOLATION THRESHOLD VOLTAGE

[75] Inventor: Wendell Phillips Noble, Milton, Vt.

[73] Assignee: International Business Machines Corporation, Armonk, N.Y.

[21] Appl. No.: 366,517

[22] Filed: Dec. 30, 1994

[51] Int. Cl.⁶ .................................................. H01L 29/76
[52] U.S. Cl. .......................... 257/372; 257/374; 257/394; 257/407; 257/510; 257/754; 257/763
[58] Field of Search .................... 257/371, 372, 257/754, 757, 763, 407, 374, 394, 510

[56] References Cited

U.S. PATENT DOCUMENTS

| | | | |
|---|---|---|---|
| 3,602,782 | 8/1971 | Klein | 317/235 |
| 3,608,189 | 9/1971 | Gray | 29/571 |
| 3,798,513 | 3/1974 | Ono | 317/235 R |
| 4,599,792 | 7/1986 | Cade et al. | 29/576 |
| 4,990,983 | 2/1991 | Custode et al. | 357/23.11 |
| 5,061,647 | 10/1991 | Roth et al. | 437/40 |
| 5,081,066 | 1/1992 | Kim | 437/200 |
| 5,210,435 | 5/1993 | Rothe et al. | 257/344 |
| 5,247,198 | 9/1993 | Homma et al. | 257/371 |
| 5,268,330 | 12/1993 | Givens et al. | 437/195 |
| 5,418,179 | 5/1995 | Hotta | 257/754 |
| 5,514,910 | 5/1996 | Koyama | 257/754 |

*Primary Examiner*—Edward Wojciechowicz
*Attorney, Agent, or Firm*—Heslin & Rothenberg, P.C.

[57] ABSTRACT

A MOSFET has shallow trenches of a thick oxide for isolating the MOSFET device from a surrounding substrate. The MOSFET has a gate wiring layer that includes co-aligned metallurgy of a predetermined work function at regions where the gate wiring layer passes over the oxide of the isolation trenches. The co-aligned metallurgy of predetermined work function is operative to increase the parasitic threshold voltage associated with the MOSFET's parasitic leakage currents.

10 Claims, 4 Drawing Sheets

MOSFET DEVICE HAVING CONTROLLED PARASITIC ISOLATION THRESHOLD VOLTAGE

TECHNICAL FIELD

This invention relates to a MOSFET (Metal On Silicon Field Effect Transistor). More particularly, the present invention relates to controlling the parasitic threshold voltage characteristics of a MOSFET.

BACKGROUND ART

A MOSFET has a gate region for controlling a flow of charge between a source and drain of the FET in accordance with the gate to source voltage of the FET. When a voltage is applied to the gate of a MOSFET transistor, hereinafter FET, the voltage induces first a depletion region within semiconductor material beneath a gate oxide region and then finally a channel of an appropriate carrier for allowing a flow of charge between the drain and the source of the FET.

For a FET having trench isolation regions surrounding an active region thereof, gate metallization extends over an oxide of the isolation region on a first side of the gate and overhangs the gate on an opposite side by a slight amount. The portions of the gate metallization that extend over the isolation regions create residual fields within the oxide of the trench isolation regions. The residual fields are directed toward walls of the semiconductor substrate associated with the active region of the FET and to the substrate floors of the trench isolation regions. These fields, if of sufficient magnitude, create carrier channels in the walls of the active region of the semiconductor substrate and in the substrate floors beneath the isolation regions for allowing parasitic leakage currents to flow in the walls of the active region and in the floor beneath the isolation regions in parallel with the current flowing in the main channel on top of the active region. What is desired, therefore, is a way of controlling the parasitic voltage threshold associated with generating these parasitic leakage currents.

DISCLOSURE OF INVENTION

It is an object of the present invention to provide an improved MOSFET.

It is another object of the present invention to provide an improved MOSFET having a controlled parasitic voltage threshold.

It is another object of the present invention to provide a MOSFET wherein the parasitic voltage threshold is greater than the main voltage threshold of the MOSFET.

In furtherance of these objectives, the present invention provides a trench isolated FET having a wiring layer coupled to a gate active area of the FET. Metallurgy of a predetermined work function relative the work function of the wiring layer resides intermediate the wiring layer and a thick oxide of the trench regions.

In accordance with another aspect of the present invention, the FET has been heated such that the metallurgy and polysilicon of the wiring layer react to form a silicide.

In accordance with another embodiment of the present invention, a method is provided for forming a trench isolated FET transistor. A semiconductor substrate has a FET active region isolated by trench oxide boundaries, and covered with an oxide and a nitrite pad. A layer of metallurgy of predetermined work function is deposited over the substrate including the nitride pad and the shallow trench oxide boundaries. The deposited metallurgy is then planarized by a Chem- Mechanical polish until the nitride pad is exposed.

Thereafter, the nitride pad is removed leaving a hole in the deposited metallurgy exposing the oxide at the active region of the FET. The exposed oxide is then removed exposing the active region of the FET. An oxide film is then re-grown over the exposed active region of the FET. Thereafter polysilicon is deposited over the metallurgy and the oxide film as exposed through the hole of the metallurgy. The polysilicon is then patterned in accordance with a desired gate wiring pattern for providing a gate wiring layer including a gate portion of the active region of the FET. The metallurgy is then etched using the patterned polysilicon as an etching mask, thus leaving metallurgy intermediate the gate wiring layer for regions over the oxide of the trenches.

In accordance with one aspect of this embodiment, another step of heating is provided so that the metallurgy interacts with the polysilicon gate wiring layer to form a silicide.

In accordance with another aspect of the present invention, spacers are formed at the sides of the nitride pad before depositing the layer of metallurgy so as to prevent the metallurgy from contacting the active region of the FET.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

For controlling threshold voltage characteristics, a metal of high work function is provided intermediate gate metallization and isolation regions of a shallow trench isolated MOSFET.

Figure 1:
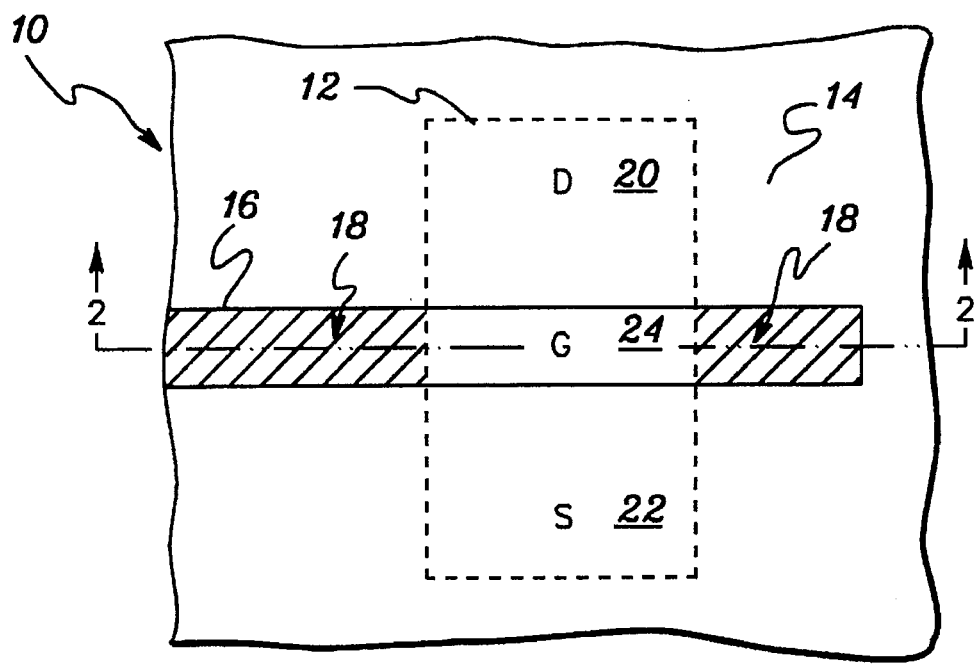
FIG. 1 is a plan view of a FET in accordance with the present invention illustrating trench isolation regions and an active region of the FET.

A shallow trench isolated FET transistor is illustrated in FIG. 1 wherein gate metallization 16 extends from left to right over a gate of the FET and openings are established for drain and source contacts of the FET transistor. The drain 20, source 22 and gate 24 are parts of an active region 12 of the FET transistor. The active region 12 is surrounded by shallow isolation trenches filled with oxide 14. Active region 12 thus appears as an island plateau surrounded by oxide 14 of the shallow trenches.

Figure 2:
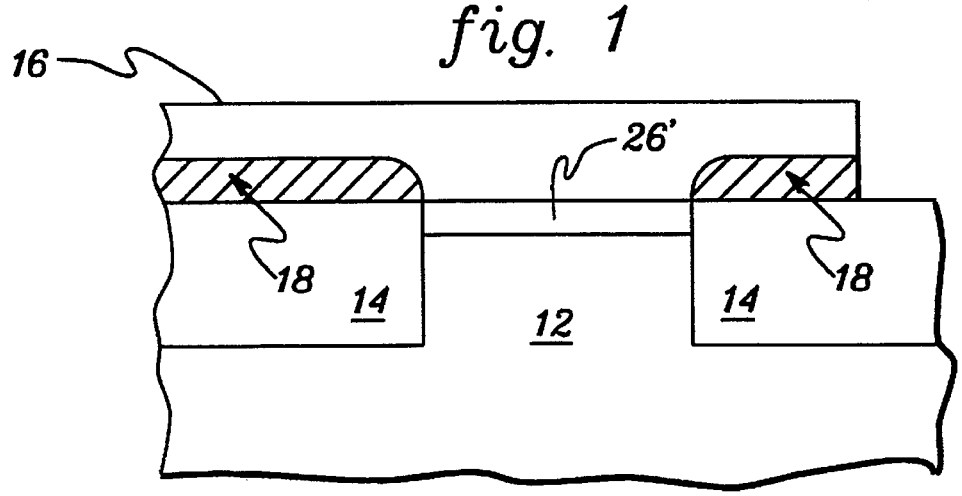
FIG. 2 is a cross-sectional view of the FET of FIG. 1 showing placement of metallurgy of predetermined work function.

A cross-section of the FET transistor is illustrated in FIG. 2. Gate metallization 16 extends over oxide 14 of a first shallow trench, over gate oxide 26', and partially over oxide 14 of a second shallow trench. In the present invention, a metal of predetermined work function 18 is provided intermediate the gate metallization 16 and the oxide regions 14 of the shallow trenches.

Work function W relates to the energy by which an electron is bound in a given metal; conversely, work function W is the amount of energy which is required of a photon to eject an electron from the given metal. Energy E of light is related to the frequency "v" of the light by the known equation:

$$E = hv \qquad \text{Eq. 1}$$

wherein h is Planck's constant. Therefore, the minimum frequency $v_o$ of light required to eject an electron from a given metal can be related to the work function W of the given metal by the following equation.

$$v_o = \frac{W}{h} \qquad \text{Eq. 2}$$

With reference to the cross-sectional view of FIG. 2, the source 22 (not shown) of the FET transistor would be located in active region 12 above the illustrated page whereas the drain 20 (not shown) of the FET transistor would be located in the active region 12 beneath the page. The gate region 24 is shown in the cross-sectional view at active region 12. As mentioned hereinbefore, when gate metallization 16 receives a bias potential (with respect to substrate 12), a carrier channel is provided just beneath gate oxide 26'.

Figure 4:
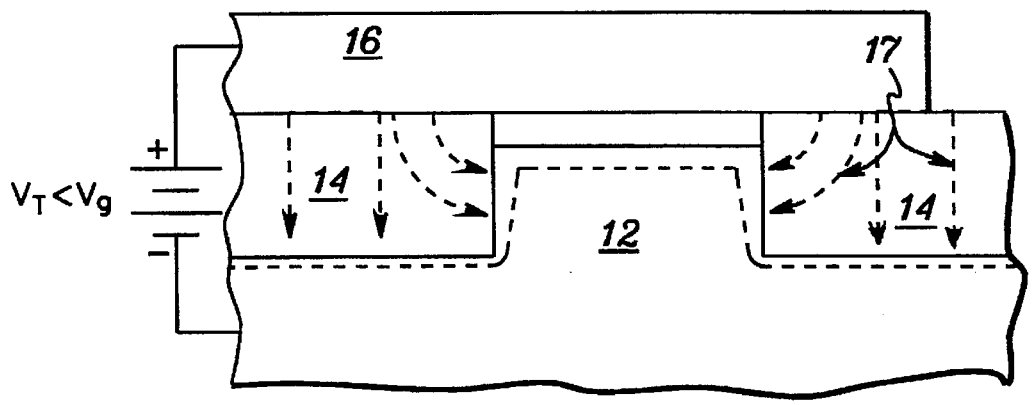
FIG. 4 is a cross sectional view of a prior art FET showing stray fields of gate metallization forming parasitic side wall channels in the FET's active region.

A problem with the prior art topology is illustrated in FIG. 4 wherein stray fields 17 of gate metallization 16 orient themselves toward the side walls of the active region 12 of the semiconductor FET and to the substrate floor beneath oxide 14 of the isolation regions. The stray fields 17 oriented toward the side walls of the active region 12 cause parasitic carrier channels to form along the side walls in parallel with the desired carrier channel on top of active region 12. The stray fields 17 oriented toward the floors of the isolation regions cause parasitic channels to form in the floors in parallel with the desired carrier channel on top of action region 12. Thus, the parasitic fields 17 enable parasitic leakage currents to flow in parallel with the desired current at the top of active region 12. The induced side and floor channels, i.e. edge and floor parasitics, typically have a distortion voltage threshold characteristic within 300 mV of the main device voltage threshold characteristics. By reducing the magnitude of the stray field 17 within oxide region 14, the parasitic edge and floor affects can likewise be reduced.

In accordance with the present invention, metallization 18 of high work function is provided intermediate gate metallization 16 and oxide 14 of the isolation regions. As mentioned hereinbefore, work function of a given metal relates to the amount of energy required to eject an electron from the given metal. With the high work function metallization, a higher gate voltage is required to overcome a metal to silicon substrate work function difference $\phi_{ms}$ before inducing stray fields 17 within oxide 14 of the isolation regions. Thus, a greater voltage is required to provide residual fields 17 strong enough for inducing parasitic channels in the side walls of active region 12 and the floors of the isolation regions. In effect, the voltage threshold of the parasitic leakage currents has been increased by a magnitude corresponding to the work function differential between the high work function metallization 18 and the original gate metallization 16 over the isolation regions 14. Note that the ability to induce parasitic leakage currents in the side walls of the active region 12 and floors of the isolation regions is still present; however, the parasitic voltage threshold characteristic has been shifted with respect to the main voltage threshold characteristic associated with creating a main channel on top of the plateau just beneath the gate oxide 26'.

In the gate area of the active region 12, there is an absence of metallization of high work function and the characteristic threshold voltage is less than the parasitic threshold voltage associated with the regions of high work function metallization 18. Therefore, once a gate potential matching the parasitic voltage threshold is provided for generating induced currents in the side walls of the plateau of active region 12 and the floors of the isolation regions, the magnitude of the main channel current just beneath gate oxide 26' is sufficiently large to make the affects of the leakage currents negligible relative the main current.

In selecting the metal of high work function, the work function $\phi_{ms}$, for the metal should be greater than the work function of N+ polysilicon making up the gate wiring layer for NMOS devices; however, for PMOS devices, it should be below that of P+ polysilicon making up the gate wiring layer. In a preferred embodiment of the present invention, Tungsten is used as the metallization of predetermined work function, for Tungsten has a work function intermediate N+ polysilicon and P+ polysilicon. However, it should be apparent that other metals may be used in accordance with the design parameters of the specific application.

Figure 3A:
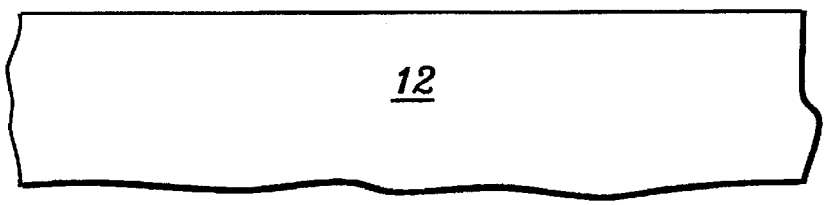
FIGS. 3a–3m are cross sectional views illustrating the processing steps associated with fabricating a FET in accordance with the present invention.
Figure 3B:
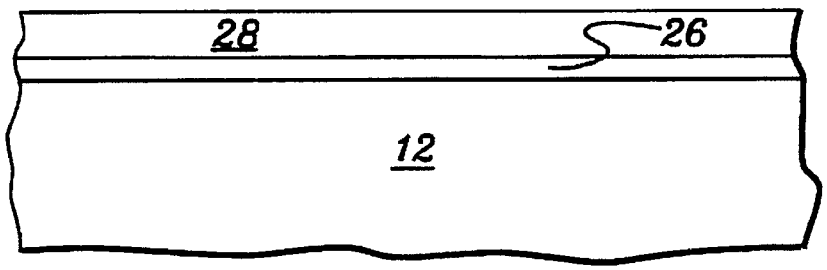
Figure 3C:
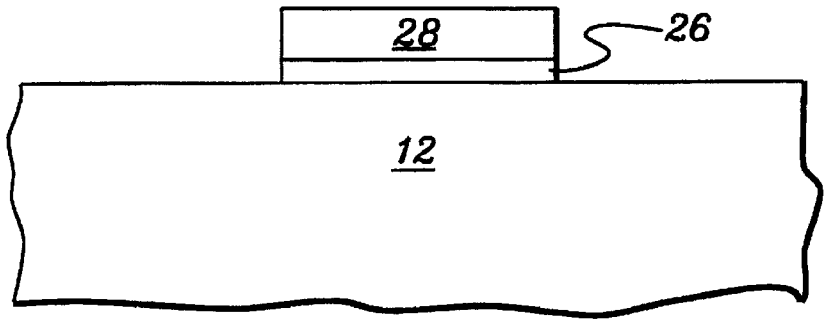
Figure 3D:
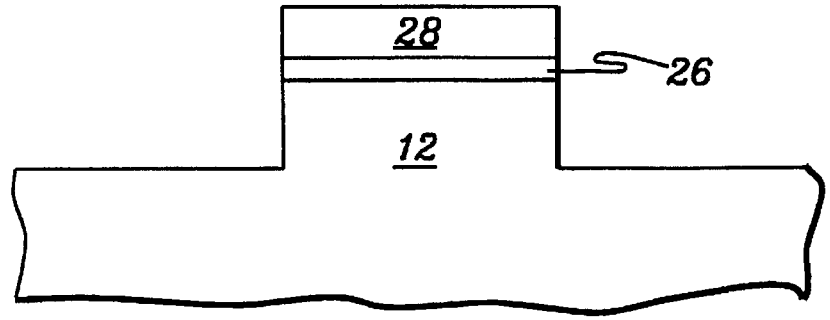
Figure 3E:
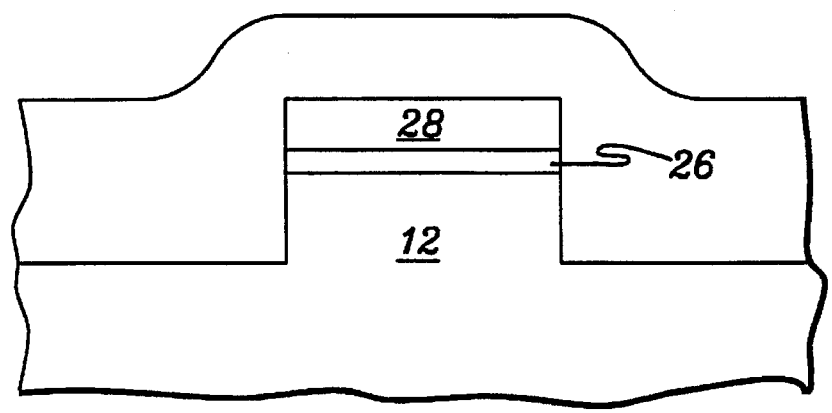

FIGS. 3a–3j illustrate the processing steps required for forming the structure of the present invention. FIG. 3a shows the silicon substrate 12 at its initial starting condition. In FIG. 3b, an oxide layer 26 and a nitride layer 28 are deposited over the substrate including an area associated with the active region of a FET. With reference to FIG. 3c, the nitride layer 28 and oxide layer 26 have been etched in accordance with an appropriate etching mask to provide nitride pad 28 and oxide pad 26 over the predetermined active area. Nitride pad 28 and oxide pad 26 subsequently serve as etching blocks during etching of trenches within the semiconductor substrate 12 surrounding the FET active region. In FIG. 3d, the silicon of the semiconductor substrate 12 has been etched away to form isolation trenches. In this description, the semiconductor substrate is described as silicon; however, it should be apparent that the same principals can be applied for other semiconductor substrates such as GaAs. Normally, the etching depth for the trenches is about 0.5 micrometers. What is left after etching the trenches is an active region plateau 12 with a gate stack of oxide pad 26 and nitride pad 28. Note that the nitride 28 and oxide 26 are formed over the entire active region of the FET transistor, including drain 20, gate 24 and source 22 areas of the FET. After etching away the shallow trenches for the isolation regions, a thermo-oxide is grown over the etched silicon substrate and an oxide deposition provided for filling the trench regions. The oxide deposition also covers the gate stack as shown in FIG. 3e.

Figure 3F:
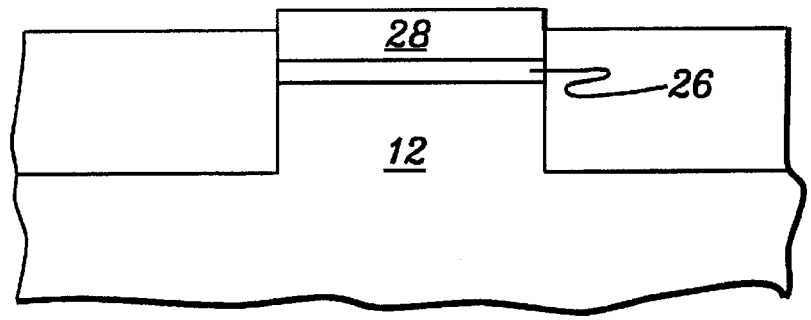
Figure 3G:
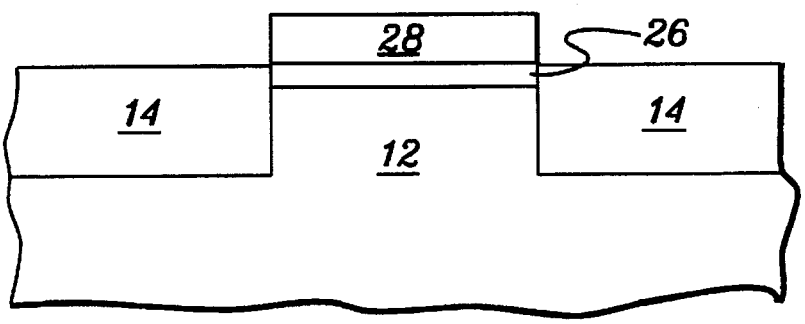

In FIG. 3f, a Chem-Mechanical polish has been provided for removing the oxide down to a height associated with the nitride pad. As known, Chem-Mechanical polishing employs selective slurries which have different removal rates for substances with different etch rates for providing co-planar etching. The techniques are described in U.S. Pat. No. 4,944,836 to Beyer et al., entitled "Chem-Mech Polishing Method for Producing Co-Planar Metal/Insulator Films on a Substrate," which is hereby incorporated by reference. Note that during the etching, the oxide is softer than the nitride pad so that a slight offset results between the top of nitride pad 28 and the top of the oxide 14 associated with the isolation regions. To further accentuate this offset, a differential etch may be used after the chem-mechanical polishing so as to etch oxide 14 of the isolation trench regions and provide, as shown in FIG. 3g, a greater offset between the top of nitrite pad 28 and the top of the oxide 14 associated with the isolation regions.

Normally, etching tolerances are sufficient for assuring that the top of oxide 14 has a height equal to or above the top of oxide layer 26 over the active region of the FET. This assures that there is no exposure to the silicon substrate of active region 12 which remains buried beneath oxide 26 and surrounded on appropriate sides by oxide 14. However, should the tolerancing not be sufficient for assuring or guaranteeing that the active region remains buried and surrounded by oxide, then it would be appropriate to provide spacers 30 on the sides of nitride pad 28 before continuing processing. Thus, in FIG. 3h, the optional spacers 30 are provided along the sides of nitride pad 28 to assure that there is no exposure of active region 12.

Figure 3H:
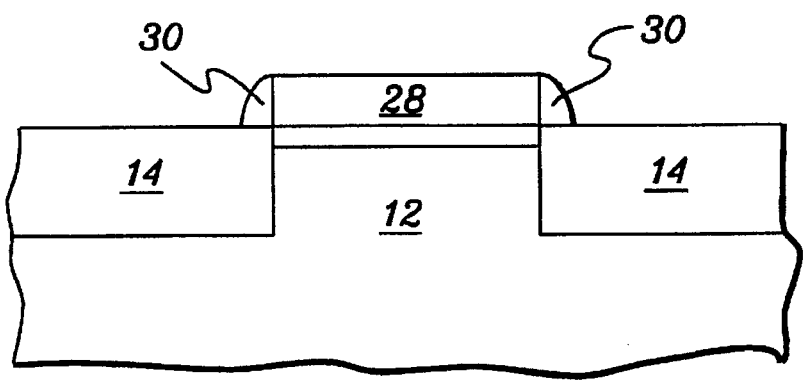
Figure 3I:
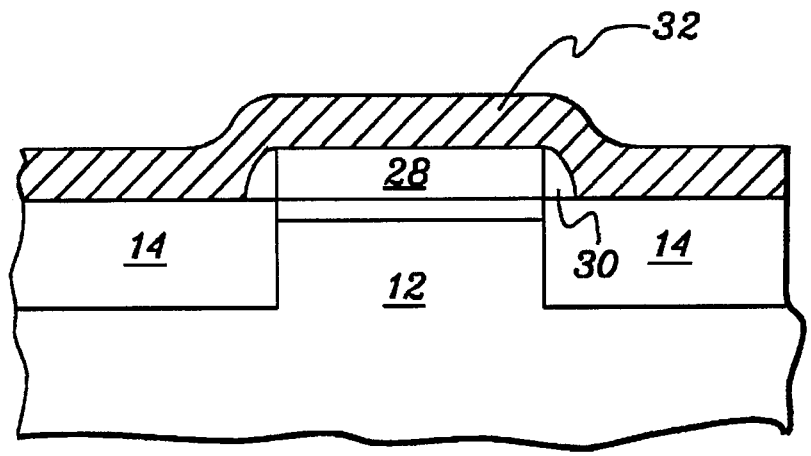

In providing spacers 30, a nitride passivation film is first deposited conformally over the substrate. A nitride material is disclosed for the passivation film, but another suitable material can be used if of a structure and function similar in kind to that of the nitride material. After depositing the passivation film, a directional reactive ion etch (RIE) is performed along a vertical axis perpendicular to the substrate in order to etch a minimum thickness of the passivation film at planar regions thereof. As a result, passivation material remains alongside vertical walls of the substrate surface. As shown in FIG. 3h, passivation material is left alongside the vertical walls of the gate stack structure.

Next, a deposition of metal of predetermined work function is provided over the substrate which buries nitride pad 28. The metal 32 of predetermined work function conforms to the upper surface profile of the semiconductor substrate. Typically, the metal of predetermined work function is deposited with a depth of 100 angstroms to 1,000 angstroms. In the present invention, tungsten is used as the metal of predetermined work function because it has a work function intermediate N+ polysilicon and P+ polysilicon, the gate wiring layers of N channel and P channel MOSFET devices respectively. However, as mentioned hereinbefore, metals of other work function can be used in accordance with the work function differential needed for obtaining a desired parasitic voltage threshold. The metal must also have the appropriate refractory properties in order to withstand thermal cycles of subsequent processing steps.

It is known that the voltage threshold for a FET transistor is directly proportional to the work function differential between the FET's gate metallization and substrate, i.e. $\phi_{ms}$. Therefore, a work function metal 32 is selected for providing the desired $\phi_{ms}$ to effect the desired voltage threshold characteristic. Equation 1 shows the relationship between voltage threshold $V_t$ and the work function potential difference $\phi_{ms}$.

$$V_t = \phi_{ms} + 2\phi_f + \frac{Q_b}{C_{ox}} - \frac{Q_{ss}}{C_{ox}} \qquad \text{Eq. 3}$$

$\phi_{ms}$ is equal to the work function difference that exists between the gate metallization and the substrate material (i.e. silicon). $\phi_f$ is equal to the Fermi level of the substrate material. $Q_b$ is equal to the charge stored in the depletion region, whereas $C_{ox}$ is equal to the gate oxide capacitance per unit area, and $Q_{ss}$ is equal to the charge density in the oxide at the silicon interface. Thus, it is apparent that the voltage threshold $V_t$ is directly proportional to the work function potential difference $\phi_{ms}$ between the gate metallization and the substrate material.

Figure 3J:
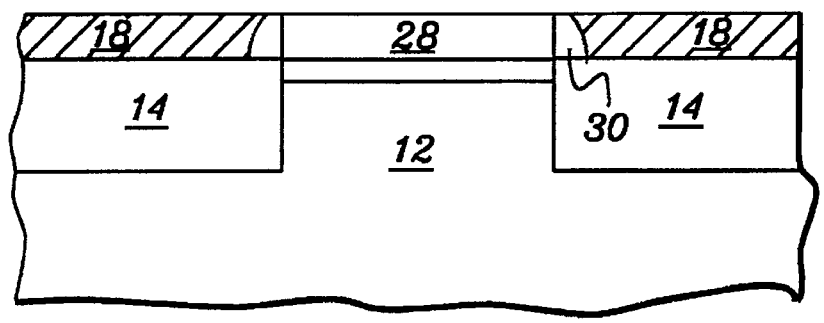

After depositing the metal 32 of predetermined work function over the semiconductor substrate, a Chem-Mechanical polish is used to etch down the structure in a planarized fashion. This results in the formation as shown in FIG. 3j wherein the metal of predetermined work function 18, i.e. Tungsten, surrounds nitride pad 28 and spacers 30 over active region 12.

Figure 3K:
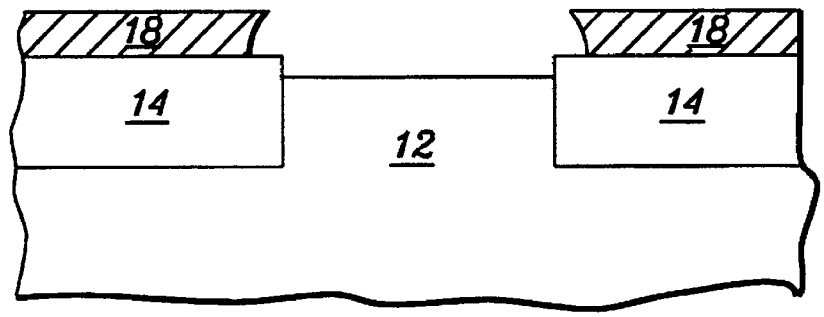

Next, with reference to FIG. 3k, nitride pad 28, spacers 30 and oxide pad 26 are removed leaving silicon of the substrate exposed in an opening of Tungsten 18. The nitride 28 and oxide 26 are removed by, for example, selective wet etchings of phosphoric and hydrofluoric etching baths respectively, which etch the nitride and oxide while leaving the metal 18 alone.

Figure 3L:
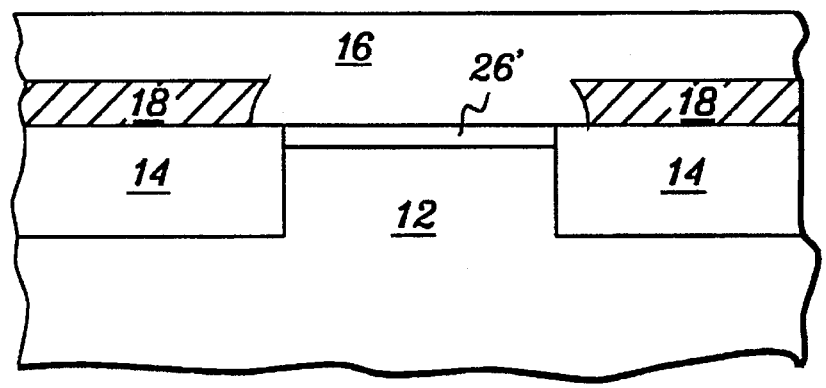
Figure 3M:
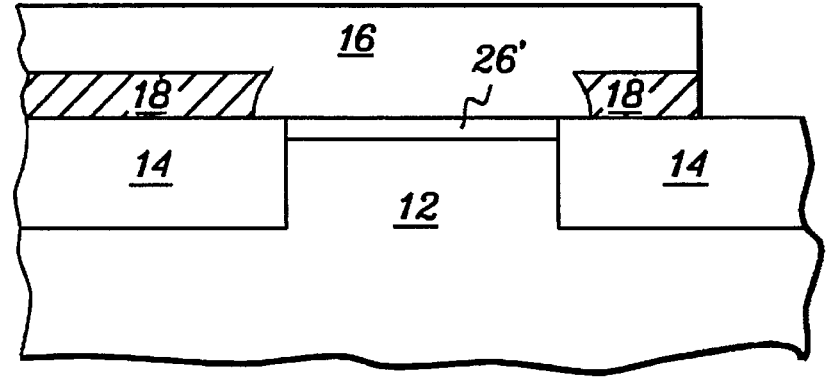

As shown in FIG. 3l, a gate oxide layer 26' is regrown over active region 12. After growing the oxide over active region 12, a polysilicon material 16 is deposited over the semi-conductor substrate. Next, the polysilicon material is patterned in accordance with the desired gate wiring pattern. At this point, the polysilicon of the gate wiring layer is surrounded by (Tungsten) metallization 18 with windows (not shown) opening to the oxide layer over the drain and source areas of active region 12. Next, metallization 18 is etched as exposed using the pattern of the polysilicon gate wiring layer 16 as a mask. What is left, therefore, with reference to FIG. 3m is the polysilicon gate wiring layer 16 co-aligned with metallization 18 of predetermined work function over regions associated with isolation trenches 14.

At this point, normal FET processing is resumed for providing diffusions to the drain and source areas of the active region and thereafter providing metallization contacts to the source and drain of the FET. During this subsequent processing, the temperature, in one aspect of the present invention, reaches a temperature sufficient to cause the polysilicon of the gate wiring layer to react with the metallization of predetermined work function to form a silicide. This silicide is believed to be more stable wherein migration of the metal of predetermined work function is reduced.

Assuming an NMOS device has been formed, a voltage threshold associated with a main channel over the active region of the FET is proportional to the work function difference $\phi_{ms}$ between the N+ polysilicon gate wiring layer 16 and silicon substrate 12. In contrast, the voltage threshold associated with the parasitic channels in the side walls of the active region (adjacent the isolation trench regions) and floors of the isolation regions is proportional to the work function difference $\phi_{ms}$ between Tungsten 18 and silicon substrate 12. By providing the different threshold characteristics between the main channel and the parasitic channels, the parasitic effects may be made negligible with respect to the main characteristics.

While the invention has been particularly shown and described with reference to preferred embodiments thereof, it will be understood by those skilled in the art that various changes in form and details may be made therein without departing from the spirit and scope of the invention.

I claim:

1. A trench isolated FET comprising:
    a gate wiring layer coupled without any intermediate metallurgy to a gate active area of the FET;
    wherein the gate wiring layer also passes over an oxide of an isolating trench; and
    metallurgy of a predetermined work function different from a work function of the gate wiring layer resides intermediate said gate wiring layer and said oxide of the isolating trench, wherein a parasitic voltage threshold associated with said isolating trench is higher than a voltage threshold associated with said gate active area.

2. A trench isolated FET according to claim 1, wherein said FET is an N-Channel MOSFET and said metallurgy has a work function greater than said gate wiring layer.

3. A trench isolated FET according to claim 1, wherein said FET is a P-Channel MOSFET and said metallurgy has a work function less than said gate wiring layer.

4. A trench isolated FET according to claim 1, wherein said gate wiring layer comprises polysilicon.

5. A trench isolated FET according to claim 4, wherein said FET has been heated such that said metallurgy and said polysilicon have reacted to form a silicide.

6. A trench isolated FET according to claim 1, wherein said isolating trench is a shallow isolating trench.

7. A trench isolated FET comprising a gate wiring layer and metallurgy of predetermined work function co-aligned with and underlying the gate wiring layer at regions associated with isolation trenches of the trench isolated FET, wherein the gate wiring layer provides an interconnection to an active gate region of the trench isolated FET, the co-aligned metallurgy not being present with the gate wiring layer at said interconnection to said active gate region and being present only where said gate wiring layer overlaps said isolation trenches, wherein a parasitic voltage threshold associated with said isolation trenches is higher than a voltage threshold associated with the active gate region of said FET.

8. A trench isolated FET according to claim 7 wherein said metallurgy has a work function greater than said wiring layer.

9. A trench isolated FET according to claim 7, wherein said metallurgy has a work function less than said wiring layer.

10. A trench isolated FET according to claim 7, wherein said wiring layer includes polysilicon and said metallurgy and said polysilicon have been heated to form a silicide at regions associated with said metallurgy.

* * * * *